US012013355B2

(12) United States Patent
Wang et al.

(10) Patent No.: US 12,013,355 B2
(45) Date of Patent: Jun. 18, 2024

(54) METHODS AND SYSTEMS FOR COMPACT, SMALL SPOT SIZE SOFT X-RAY SCATTEROMETRY

(71) Applicant: KLA Corporation, Milpitas, CA (US)

(72) Inventors: David Y. Wang, Santa Clara, CA (US); Kerstin Purrucker, Huettenberg (DE); Michael Friedmann, Mountain View, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/411,030

(22) Filed: Aug. 24, 2021

(65) Prior Publication Data

US 2022/0196576 A1 Jun. 23, 2022

Related U.S. Application Data

(60) Provisional application No. 63/126,544, filed on Dec. 17, 2020.

(51) Int. Cl.
*G01N 23/201* (2018.01)
(52) U.S. Cl.
CPC ..... *G01N 23/201* (2013.01); *G01N 2223/054* (2013.01); *G01N 2223/306* (2013.01); *G01N 2223/6116* (2013.01)
(58) Field of Classification Search
CPC ........... G01N 23/201; G01N 2223/054; G01N 2223/306; G01N 2223/6116;
(Continued)

(56) References Cited

U.S. PATENT DOCUMENTS 5,608,526 A    3/1997   Piwonka-Corle et al.
5,859,424 A    1/1999   Norton et al.
(Continued)

FOREIGN PATENT DOCUMENTS

WO    2020-214745 A1    10/2020

OTHER PUBLICATIONS

International Search Report dated Mar. 24, 2022, for PCT Application No. PCT/US2021/062326. Filed on Dec. 8, 2021 by KLA Corporation, 3 pages.
(Continued)

*Primary Examiner* — Dani Fox
*Assistant Examiner* — Soorena Kefayati
(74) *Attorney, Agent, or Firm* — Spano Law Group; Joseph S. Spano

(57) ABSTRACT

Methods and systems for performing measurements of semiconductor structures based on high-brightness, Soft X-Ray (SXR) illumination over a small illumination spot size with a small physical footprint are presented herein. In one aspect, the focusing optics of an SXR based metrology system project an image of the illumination source onto a specimen under measurement with a demagnification of at least 1.25. In a further aspect, an illumination beam path from the x-ray illumination source to the specimen under measurement is less than 2 meters. In another aspect, SXR based measurements are performed with x-ray radiation in the soft x-ray region (i.e., 80-3000 eV). In some embodiments, SXR based measurements are performed at grazing angles of incidence in a range from near zero degrees to 90 degrees. In some embodiments, the illumination optics project an image of an illumination source onto a specimen under measurement with a demagnification of 50, or less.

31 Claims, 8 Drawing Sheets

(58) Field of Classification Search
CPC . G03F 7/70625; G03F 7/70633; H01L 22/12; H05G 2/008; H05G 2/006; H05G 2/005
See application file for complete search history.

(56) References Cited

U.S. PATENT DOCUMENTS

| | | | |
|---|---|---|---|
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,895,075 B2 | 5/2005 | Yokhin et al. | |
| 6,972,852 B2 | 12/2005 | Opsal et al. | |
| 7,478,019 B2 | 1/2009 | Zangooie et al. | |
| 7,755,764 B2 | 7/2010 | Kwak et al. | |
| 7,826,071 B2 | 11/2010 | Shchegrov et al. | |
| 7,907,264 B1 | 3/2011 | Krishnan | |
| 7,929,667 B1 | 4/2011 | Zhuang et al. | |
| 7,933,026 B2 | 4/2011 | Opsal et al. | |
| 8,749,179 B2 | 6/2014 | Liu et al. | |
| 8,860,937 B1 | 10/2014 | Dziura et al. | |
| 8,879,073 B2 | 11/2014 | Madsen et al. | |
| 8,941,336 B1 | 1/2015 | Liu et al. | |
| 9,588,066 B2 | 3/2017 | Pois et al. | |
| 9,915,522 B1 | 3/2018 | Jiang et al. | |
| 10,041,873 B2 | 8/2018 | Krishnan | |
| 10,119,925 B2 | 11/2018 | Pois et al. | |
| 10,145,674 B2 | 12/2018 | Krishnan | |
| 10,217,625 B2 * | 2/2019 | Bezel | H01J 65/04 |
| 10,281,263 B2 | 5/2019 | Krishnan | |
| 10,338,013 B1 * | 7/2019 | Brodie | H01J 37/28 |
| 10,481,112 B2 | 11/2019 | Pois et al. | |
| 10,959,318 B2 | 3/2021 | Khodykin et al. | |
| 2008/0273662 A1 * | 11/2008 | Yun | G03F 7/70625 378/74 |
| 2012/0294426 A1 * | 11/2012 | Panine | G01N 23/201 378/147 |
| 2013/0114085 A1 | 5/2013 | Wang et al. | |
| 2013/0188160 A1 * | 7/2013 | Ruoff | G03F 7/70466 355/52 |
| 2013/0304424 A1 | 11/2013 | Bakeman et al. | |
| 2014/0019097 A1 | 1/2014 | Bakeman et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0246607 A1 | 9/2014 | Bykanov et al. | |
| 2014/0297211 A1 | 10/2014 | Pandev et al. | |
| 2014/0306115 A1 | 10/2014 | Kuritsyn et al. | |
| 2014/0316730 A1 | 10/2014 | Shchegrov et al. | |
| 2015/0008335 A1 | 1/2015 | Bykanov et al. | |
| 2015/0042984 A1 | 2/2015 | Pandev et al. | |
| 2015/0046118 A1 | 2/2015 | Pandev et al. | |
| 2015/0076359 A1 | 3/2015 | Bykanov et al. | |
| 2015/0110249 A1 | 4/2015 | Bakeman et al. | |
| 2015/0117610 A1 | 4/2015 | Veldman et al. | |
| 2015/0199463 A1 | 7/2015 | Iloreta et al. | |
| 2015/0204664 A1 | 7/2015 | Bringoltz et al. | |
| 2015/0204802 A1 * | 7/2015 | Pois | G01N 23/207 378/86 |
| 2015/0247811 A1 * | 9/2015 | Yun | G01N 23/2076 378/45 |
| 2015/0285749 A1 * | 10/2015 | Moncton | G01N 23/207 378/86 |
| 2015/0300965 A1 | 10/2015 | Sezginer | |
| 2015/0369761 A1 * | 12/2015 | Ryan | G01N 23/2055 378/74 |
| 2016/0128171 A1 | 5/2016 | Kuritsyn et al. | |
| 2016/0178540 A1 * | 6/2016 | Yun | G01N 23/205 378/83 |
| 2016/0202193 A1 | 7/2016 | Hench et al. | |
| 2016/0216197 A1 | 7/2016 | Bringoltz et al. | |
| 2016/0249442 A1 | 8/2016 | Kuritsyn et al. | |
| 2017/0094765 A1 * | 3/2017 | Chimmalgi | G02B 6/0008 |
| 2017/0167862 A1 * | 6/2017 | Dziura | G01B 15/02 |
| 2017/0343493 A1 * | 11/2017 | Reischig | G01N 23/203 |
| 2017/0357155 A1 | 12/2017 | Quintanilha et al. | |
| 2018/0059019 A1 | 3/2018 | Houssam et al. | |
| 2018/0106735 A1 * | 4/2018 | Gellineau | G01N 23/2055 |
| 2018/0108578 A1 * | 4/2018 | Pandev | G01N 21/9503 |
| 2018/0188192 A1 * | 7/2018 | Artemiev | G01N 23/201 |
| 2018/0238814 A1 * | 8/2018 | Sapiens | G01J 3/2803 |
| 2018/0299259 A1 * | 10/2018 | Shchegrov | G01N 23/201 |
| 2019/0017946 A1 * | 1/2019 | Wack | G01N 23/20008 |
| 2019/0094711 A1 * | 3/2019 | Atkins | G01N 21/211 |
| 2019/0212281 A1 | 7/2019 | Shchegrov et al. | |
| 2019/0215940 A1 * | 7/2019 | Khodykin | H05G 2/008 |
| 2019/0293578 A1 * | 9/2019 | Gellineau | G01N 23/201 |
| 2019/0317028 A1 * | 10/2019 | Matney | G01N 23/207 |
| 2020/0060014 A1 * | 2/2020 | Vinokhodov | H01J 35/10 |
| 2020/0100350 A1 * | 3/2020 | Van Voorst | G01N 21/956 |
| 2020/0294774 A1 | 9/2020 | Chang et al. | |
| 2021/0063329 A1 | 3/2021 | Kuznetsov et al. | |
| 2021/0136901 A1 | 5/2021 | Chang et al. | |
| 2021/0136902 A1 | 5/2021 | Chang et al. | |

OTHER PUBLICATIONS

Lemaillet, et al., "Intercomparison between optical and x-ray scatterometry measurements of FinFET structures," Proc. SPIE, v. 8681, p. 86810Q, 2013.

Kline, et al., "X-ray scattering critical dimensional metrology using a compact x-ray source for next generation semiconductor devices," J. of Micro/Nanolithography, MEMS, and MOEMS, 16(1), 014001 (2017).

* cited by examiner

METHODS AND SYSTEMS FOR COMPACT, SMALL SPOT SIZE SOFT X-RAY SCATTEROMETRY

CROSS REFERENCE TO RELATED APPLICATION

The present application for patent claims priority under 35 U.S.C. § 119 from U.S. provisional patent application Ser. No. 63/126,544, filed Dec. 17, 2020, the subject matter of which is incorporated herein by reference in its entirety.

TECHNICAL FIELD

The described embodiments relate to x-ray metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension measurements are performed on targets consisting of thin films, repeated periodic structures, or both. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, Gate-All-Around Field Effect Transistor (GAAFET) structures are currently being developed by semiconductor manufacturers to create ever-smaller microprocessors and memory cells. Characterization of geometry of GAAFET structures presents challenges to current metrology technology.

Accurate information concerning the material composition and shape of nanostructures is limited in the process development environment of a leading-edge front-end semiconductor fabrication facility. Scatterometric optical metrology systems rely on accurate geometric and dispersion models to avoid measurement bias. With limited knowledge of material composition and shape of nanostructures available a priori, measurement recipe development and validation are a slow and tedious process. For example, cross-sectional transmission electron microscopy (TEM) images are used to guide optical scatterometry model development, but TEM imaging is slow and destructive.

Scatterometric optical metrology tools utilizing infrared to visible light measure zero-order diffraction signals from sub-wavelength structures. As device critical dimensions continue to shrink scatterometric optical metrology sensitivity and capability is decreasing. Furthermore, when absorbing materials are present in the structure under measurement, penetration and scattering of illumination light in the optical region (e.g., 0.5-10 ev) limits the utility of conventional optical metrology systems.

Similarly, electron beam based metrology systems struggle to penetrate semiconductor structures due to absorption and scattering of the illuminating, backscattered, and secondary emission electrons.

Atomic force microscopes (AFM) and scanning-tunneling microscopes (STM) are able to achieve atomic resolution, but they can only probe the surface of the specimen. In addition, AFM and STM microscopes require long scanning times that make these technologies impractical in a high volume manufacturing (HVM) setting.

Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance.

Transmission, Small-Angle X-Ray Scatterometry (T-SAXS) systems employing photon at a hard X-ray energy level (>15 keV) have shown promise to address challenging measurement applications. However, scattering of hard x-rays from shallow structures, e.g., logic metrology applications, is weak, which severely limits achievable measurement resolution and throughput. As such, T-SAXS has not been shown to be a viable option for logic metrology applications in a high volume manufacturing environment.

T-SAXS systems achieve a small beam footprint on the wafer due to near-normal incidence illumination. However, T-SAXS systems require high energy photons (e.g., >16 keV) for adequate transmission through a wafer under measurement. Typically diffraction efficiency scales with photon energy, E, as $1/E^2$ and angular separation of diffraction orders scales at $1/E$. To avoid order overlap for a 2D-periodic structure, the solid-angular acceptance scales as $1/E^2$. These scaling factors impose a strong penalty on T-SAXS systems for metrology of shallow structures.

In addition, the diffraction patterns from all previous patterned steps are superimposed on the diffraction pattern of the current layer structure in a transmission measurement. Since the minimum pitch (i.e., period) of critical metal layers is expected to converge to values differing by only 10-20%, angular acceptance is severely restricted to separate diffraction signals at the detector. Otherwise, the geometric information of all previous layers must be fed-forward to the metrology system characterizing the current layer. Typically, within the context of a complex high volume manufacturing environment, it is very difficult to obtain and manage the required metrology and process information.

Conventional grazing incidence, small angle x-ray scatterometry (GI-SAXS) systems operate near the critical angles for reflection (e.g., grazing angle of less than one degree) for semiconductor materials and photon energies above 8 keV to maximize diffracted intensity. This leads to an extremely large illumination beam spot size projected onto the wafer (e.g., greater than 1 mm). This is so large that even scribe-line metrology targets are unusable. Thus, extremely large, specialized metrology targets must be constructed on the wafer to perform GI-SAXS measurements.

This loss of functional wafer real estate is costly. In addition, the surface sensitivity of GI-SAXS measurements is excellent, but penetration of high aspect ratio structures is very limited due to evanescent field behavior.

Soft X-ray based scatterometry and reflectometry is a promising technology to address current metrology requirements. However, currently available systems do not provide a sufficiently small illumination spot size on target with sufficient brightness in a sufficiently compact package acceptable in a high volume manufacturing environment.

In one example, a synchrotron beamline x-ray illumination source provides high brightness, soft x-ray illumination over a small illumination spot. However, a synchrotron beamline x-ray illumination source is not viable in a high volume manufacturing facility due to its extremely large physical size and high cost.

U.S. Pat. Nos. 9,588,066, 10,119,925, and 10,481,112 to Nova Measuring Instruments Ltd., Rehovot, Israel, describe soft x-ray based scatterometer and reflectometer systems. However, the disclosed systems do not employ sufficiently high brightness x-ray illumination sources, small illumination spot size on target, and small footprint to address emerging metrology applications in a high volume manufacturing environment. By way of example, the disclosed systems describe the use of a toroidal monochromator in the illumination path from the x-ray illumination source to the measurement target. A toroidal surface includes a different radius in two orthogonal directions across the optical surface. Wavefront errors induced by a toroidal surface are minimized when the x-ray illumination source is located at the center of curvature of the toroidal surface where the magnification of the toroidal surface is at or near 1×. Thus, a practical illumination optical system employing a toroidal surface is limited to magnification levels at or near 1×. As a result, a toroidal optic is unable to project the x-ray illumination source spot to the measurement target with any appreciable reduction in size without inducing unacceptable photon loss, for example, by employing an aperture. As a result, the disclosed systems employing a toroidal monochromator project an illumination spot size at the measurement target that is at least as large as the illumination source size. In addition, a toroidal surface generates significant aberrations for an extended x-ray illumination source or when illumination incidence at the toroidal surface occurs at nonzero angles of incidence (AOI). In general, a single toroidal surface is unlikely to achieve an illumination spot size of 100 micrometers or less at the measurement target at low grazing AOI (GAOI) with respect to the target unless the x-ray illumination source size is extremely small and the illumination source and its image are co-located at or near the center of curvature of the toroidal surface. Unfortunately, such a small illumination source size having acceptably small package size and low cost has yet to be realized.

In summary, there is a need for a soft x-ray based metrology system having measurement capability for both low and high aspect ratio structures and an illumination beam spot size compatible with scribe-line targets. Such a system must provide high brightness, small spot size illumination in a compact physical package compatible in size and cost with high volume semiconductor manufacturing facilities.

SUMMARY

Methods and systems for measuring structural and material characteristics of semiconductor structures based on soft x-ray illumination are presented. More specifically, methods and systems for performing measurements based on high-brightness, soft x-ray illumination over a small illumination spot size with a small overall physical footprint are presented herein.

Soft X-Ray (SXR) based measurements of a semiconductor wafer are performed over a range of wavelengths, angles of incidence, and azimuth angles with a small beam spot size (e.g., less than 50 micrometers across the effective illumination spot). In one aspect, the focusing optics of a SXR based metrology system projects an image of the illumination source onto the specimen under measurement with a demagnification of at least 1.25 (i.e., magnification factor of 0.8 or less). In some embodiments, the focusing optics of a SXR based metrology system projects an image of the illumination source onto the specimen under measurement with a demagnification of at least 2.0 (i.e., magnification factor of 0.5 or less). In a further aspect, the optical beam path from the x-ray illumination source to the specimen under measurement (i.e., the illumination beam path) is less than 2 meters.

In another aspect, the SXR based measurements are performed with x-ray radiation in the soft x-ray region (i.e., 80-3000 eV). In some embodiments, SXR based measurements are performed at grazing angles of incidence in a range from near zero degrees to 90 degrees (normal incidence). Grazing angles for a particular measurement application are selected to achieve a desired penetration into the structure under measurement and maximize measurement information content with a small beam spot size (e.g., less than 50 micrometers).

In some embodiments, the illumination optics project an image of an illumination source onto the specimen under measurement with a demagnification of up to 50 (i.e., magnification factor as small as 0.02). Such large demagnification values enable relatively large illumination source sizes to be projected onto a relatively small illumination spot on the specimen under measurement over a relatively short illumination path length. In this manner, the overall physical footprint of the SXR based metrology system is small enough to be compatible with a high volume semiconductor manufacturing facility.

In some embodiments, the illumination optics subsystem includes at least one surface having reflective power. In some of these embodiments, a coating on the reflective surface is segmented into one or more regions. Each coating region is optimized for light throughput, a range of angles of incidence, and range of wavelengths.

In some embodiments, the illumination optics subsystem includes at least one surface having diffractive power. In some of these embodiments, the diffractive surface is segmented into one or more regions. Each region is optimized for light throughput, a range of angles of incidence, and range of wavelengths.

In some embodiments, an illumination optics subsystem includes a spherical reflective objective including at least two spherical optical elements arranged in a Schwarzschild configuration.

In some embodiments, an illumination optics subsystem includes an ellipsoidal reflective optical element in the illumination optical path from an illumination source to a specimen under measurement.

In some embodiments, an illumination optics subsystem includes an elliptical reflective optical element and a reflective hyperbolic optical element in an illumination optical path from an illumination source to a specimen under measurement. In some embodiments, the optical elements are arranged in a Wolter Type 1 configuration. In general, any suitable Wolter configuration, e.g., type 2 or type 3 configuration, is contemplated within the scope of this patent document.

In some embodiments, an illumination optics subsystem includes a freeform reflective optical element in an illumination optical path from an illumination source to a specimen under measurement.

In another aspect, an illumination optics subsystem includes an internal field stop conjugate to the illumination source and the specimen under measurement.

In a further aspect, an internal field stop of an illumination subsystem is tilt shifted with respect to the specimen under measurement to minimize the size of the illumination spot projected onto the specimen under measurement.

In another aspect, the illumination source of an illumination subsystem is tilt shifted with respect to the specimen under measurement to minimize the size of the illumination spot projected onto the specimen under measurement.

In some embodiments, an illumination pupil aperture is adjustable in position and size to enhance tool-to-tool hardware matching, optimize measurement fidelity, optimize light throughput for different specimens under measurement, minimize diffraction order cross-talk, or any combination thereof.

In some embodiments, an illumination field aperture is adjustable in position and size to enhance tool-to-tool hardware matching, optimize measurement fidelity, optimize light throughput for different specimens under measurement, minimize diffraction order cross-talk, or any combination thereof.

In some embodiments, an illumination optics subsystem includes a filter that transmits illumination light in a desired spectral band (e.g., soft x-ray light) and blocks radiation in an undesired spectral band (e.g., ultra-violet, visible, infrared light, or any combination thereof).

In a further aspect, an illumination optics subsystem collects source emission and selects one or more discrete wavelengths or spectral bands, and focuses the selected light onto the specimen under measurement at a desired nominal grazing angle of incidence.

In some embodiments, an illumination optics subsystem includes graded multi-layers that select desired wavelengths or ranges of wavelengths for projection onto the specimen under measurement.

In a further aspect, a SXR based metrology system includes a collection optics subsystem including a collection pupil aperture. In some embodiments, the collection pupil aperture is adjustable in position and size to enhance tool-to-tool hardware matching, optimize measurement fidelity, and optimize light throughput for different specimens under measurement.

In a further aspect, an SXR based metrology system is employed to determine properties of a specimen (e.g., structural parameter values) based on one or more diffraction orders of scattered light. The metrology tool includes a computing system employed to acquire signals generated by a detector and determine properties of the specimen based at least in part on the acquired signals.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for measuring structural and material characteristics (e.g., material composition, dimensional characteristics of structures and films, etc.) of semiconductor structures associated with different semiconductor fabrication processes based on soft x-ray illumination are presented. More specifically, methods and systems for performing measurements of semiconductor structures based on high-brightness, soft x-ray illumination over a small illumination spot size with a small overall physical footprint are presented herein.

Soft X-Ray (SXR) based measurements of a semiconductor wafer are performed over a range of wavelengths, angles of incidence, and azimuth angles with a small beam spot size (e.g., less than 50 micrometers across the effective illumination spot). In one aspect, the focusing optics of a SXR based metrology system projects an image of the illumination source onto the specimen under measurement with a demagnification of at least 1.25 (i.e., magnification factor of 0.8 or less). In some embodiments, the focusing optics of a SXR based metrology system projects an image of the illumination source onto the specimen under measurement with a demagnification of at least 2.0 (i.e., magnification factor of 0.5 or less). In a further aspect, the optical beam path from the x-ray illumination source to the specimen under measurement (i.e., the illumination beam path) is less than 2 meters. In another aspect, the SXR based measurements are performed with x-ray radiation in the soft x-ray region (i.e., 80-3000 eV). In some embodiments, SXR based measurements are performed at grazing angles of incidence in a range from near zero degrees to 90 degrees (normal incidence). Grazing angles for a particular measurement application are selected to achieve a desired penetration into the structure under measurement and maximize measurement information content with a small beam spot size (e.g., less than 50 micrometers).

Figure 1:
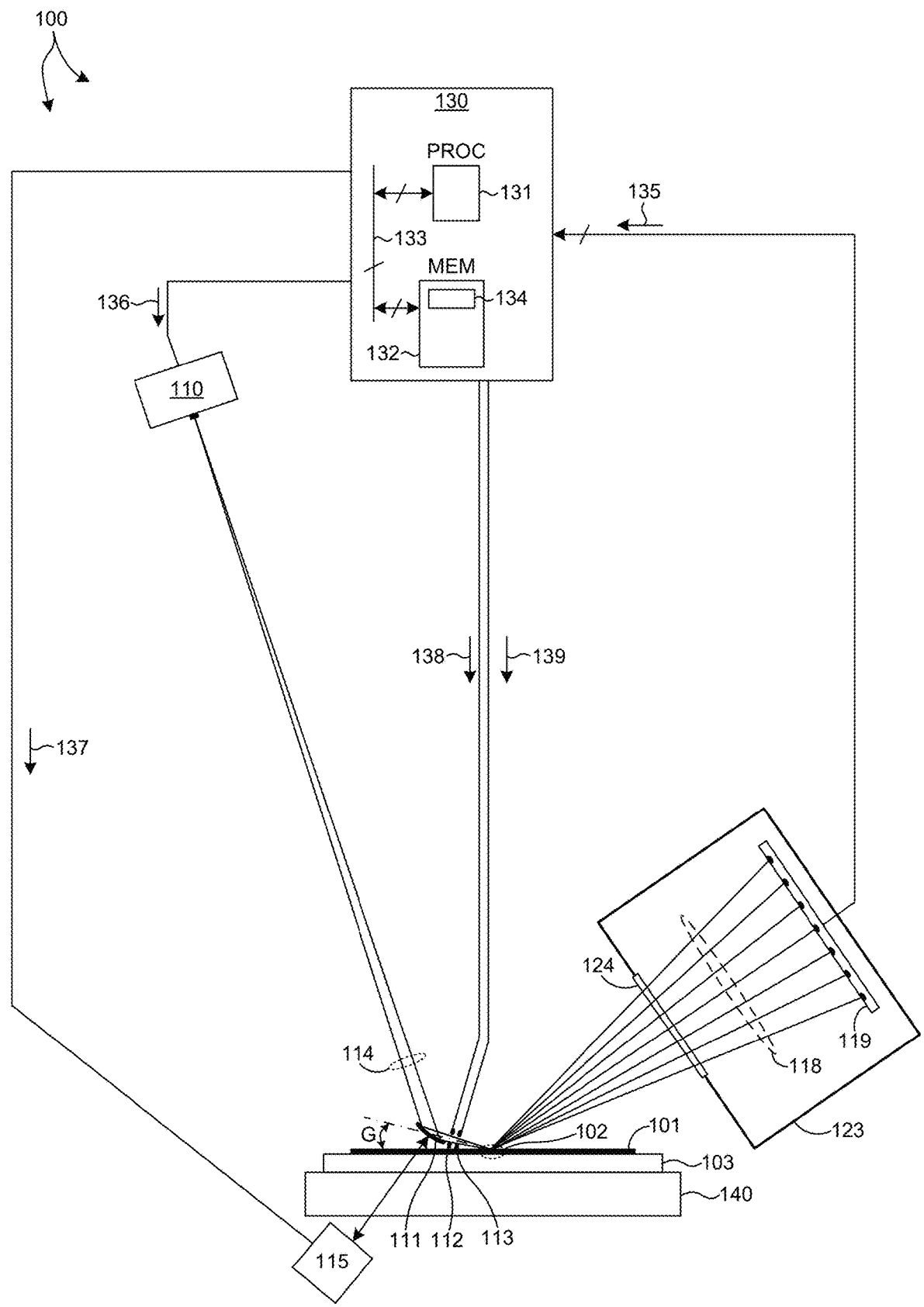
FIG. 1 is a simplified diagram illustrative of an embodiment of a SXR based metrology tool 100 for measuring characteristics of a specimen in at least one novel aspect.

FIG. 1 illustrates an embodiment of a SXR based metrology tool 100 for measuring characteristics of a specimen in at least one novel aspect. As shown in FIG. 1, the system 100 may be used to perform measurements over a measurement area 102 of a specimen 101 illuminated by an incident illumination beam spot.

In the depicted embodiment, metrology tool 100 includes an x-ray illumination source 110, focusing illumination optics 111, beam control slits 112 and 113. The x-ray illumination source 110 is configured to generate SXR radiation suitable for high throughput measurements. More specifically, X-ray illumination source 110 is a polychromatic, high-brightness, large etendue source. In some embodiments, the x-ray illumination source 110 is configured to generate x-ray radiation in a range between 80-3000 electron-volts. In general, any suitable high-brightness x-ray illumination source capable of generating high brightness SXR at flux levels sufficient to enable high-throughput, inline metrology may be contemplated to supply x-ray illumination for measurements.

In some embodiments, an x-ray source includes a tunable monochromator that enables the x-ray source to deliver x-ray radiation at different, selectable wavelengths. In some embodiments, one or more x-ray sources are employed to ensure that the x-ray source supplies light at wavelengths that allow sufficient penetration into the specimen under measurement.

In some embodiments, illumination source 110 is a high harmonic generation (HHG) x-ray source. In some other embodiments, illumination source 110 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some embodiments, any of a particle accelerator source, a liquid anode source, a rotating anode source, a stationary, solid anode source, a microfocus source, a microfocus rotating anode source, a plasma based source, and an inverse Compton source may be employed as x-ray illumination source 110.

In other examples, x-ray illumination source 101 includes an electron beam source configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

In some other embodiments, illumination source 110 is a laser sustained plasma (LSP) light source. In some of these embodiments the LSP light source includes a target material including Xenon, Krypton, Argon, Neon, Carbon Dioxide, Nitrogen, or any combination thereof. Furthermore, the target material may be maintained in a liquid or solid state before transition to plasma. In general, the selection of a suitable LSP target material is optimized for brightness in resonant SXR regions. For example, plasma emitted by Krypton provides high brightness at the Silicon K-edge. In another example, plasma emitted by Xenon provides high brightness throughout the entire SXR region of (80-3000 eV). As such, Xenon is a good choice of emitting material when broadband SXR illumination is desired.

LSP target material selection may also be optimized for reliable and long lifetime light source operation. Noble gas target materials such as Xenon, Krypton, and Argon are inert and can be reused in a closed loop operation with minimum or no decontamination processing. An exemplary SXR illumination source is described in U.S. Pat. No. 10,959,318, the content of which is incorporated herein by reference in its entirety.

In some embodiments, the wavelengths emitted by the illumination source (e.g., illumination source 110) are selectable. In some embodiments, illumination source 110 is a LSP light source controlled by computing system 130 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating SXR radiation.

As depicted in FIG. 1, computing system 130 communicates command signals 136 to illumination source 110 that cause illumination source 110 to adjust the spectral range of wavelengths emitted from illumination source 110. In one example, illumination source 110 is a LSP light source including one or more laser light sources (e.g., pump laser light sources) employed to enhance the brightness and power of a portion of the plasma spectrum, or the entirety of the plasma spectrum. In some of these examples, the LSP light source adjusts any of a pulse duration, pulse frequency, and target material composition to realize a desired spectral range of wavelengths emitted from the LSP light source. In some examples, an LSP light source target material includes Xenon maintained in a solid state, for example, on the surface of a cryogenically cooled drum, and laser light is focused on a small portion of the solid state Xenon. In some examples, an LSP light source target material includes Carbon Dioxide maintained in a solid state, for example, on the surface of a cryogenically cooled drum, and laser light is focused on a small portion of the solid state Carbon Dioxide. In some examples, an LSP light source target material includes a combination of target materials, such as Xenon and Carbon Dioxide, maintained in a solid state, for example, on the surface of a cryogenically cooled drum, and laser light is focused on a small portion of the solid state target materials. In some other examples, an LSP light source target material includes a combination of target materials, such as Xenon and Carbon Dioxide, maintained in a gaseous state.

In some embodiments, a LSP illumination source generates illumination radiation that includes wavelengths in the soft x-ray, ultraviolet, visible and infrared regions. In some embodiments, a LSP illumination source generates illumination radiation including wavelengths in a range from 300 electron volts to 400 electron volts. In some embodiments, a LSP illumination source generates illumination radiation including wavelengths in a range from 100 electron volts to 1,000 electron volts. In some embodiments, a LSP illumination source generates illumination radiation including a single wavelength (narrowband illumination).

X-ray illumination source 110 produces x-ray emission over a source area having finite lateral dimensions (i.e., non-zero dimensions orthogonal to the beam axis. Small source size enables illumination of a small target area on the specimen with high brightness, thus improving measurement precision, accuracy, and throughput. However, in general, there are limitations to the achievable size of the plasma. In some embodiments, the achievable plasma size is characterized by a lateral dimension greater than 50 micrometers, full width, half maximum intensity. In some embodiments, the plasma size is characterized by a lateral dimension greater than 100 micrometers, full width, half maximum intensity. In some embodiments, the plasma size is characterized by a lateral dimension less than 50 micrometers full width, half maximum intensity.

In some embodiments, the LSP illumination source includes an active pump laser focus adjustment operating in a closed-loop control configuration to maintain laser focus in real time to minimize plasma size and movement in plasma position.

In some embodiments, the LSP illumination source includes active control of beam shape and wavefront operating in a closed-loop manner to maintain beam shape and wavefront characteristics to minimize plasma size and movement in plasma position.

In general, x-ray illumination optics shape and direct illumination radiation to specimen 101. In one aspect, a SXR based metrology system includes illumination optics having an optical path length of less than 2 meters from one or more illumination sources to the specimen under measurement. Furthermore, the illumination optics project an image of an illumination source onto the specimen under measurement with a demagnification of at least 1.25 (i.e., magnification factor of 0.8 or less). In some embodiments, the illumination optics project an image of an illumination source onto the specimen under measurement with a demagnification of at least 2.0 (i.e., magnification factor of 0.5 or less). In this manner, an illumination source characterized by a lateral dimension of 100 micrometer, or larger, is focused down to an illumination spot size characterized by a lateral dimension of 50 micrometers or less.

In practice, manufacturing errors are a dominant contributor to large point spread function (PSF) at the illumination spot. In some embodiments, the illumination optics project an image of an illumination source onto the specimen under measurement with a demagnification of at least 4.0 (i.e., magnification factor of 0.25 or less). Employing a short optical path length (less than 2 meters) reduces the optical path length from the last focusing optical element to the specimen under measurement. Furthermore, employing a demagnification of at least 4.0 and the short optical path length from the last focusing optical element to the specimen under measurement minimizes the spread in illumination spot size due to light scattering from surface imperfections (e.g., tooling marks) of any reflective optical elements. In this manner, the expansion of the point spread function (PSF) of the illumination spot due to mid-frequency errors induced by the reflective optical surfaces is minimized.

In some embodiments, the illumination optics project an image of an illumination source onto the specimen under measurement with a demagnification of up to 50 (i.e., magnification factor as small as 0.02). Such large demagnification values enable relatively large illumination source sizes to be projected onto a relatively small illumination spot on the specimen under measurement over a relatively short illumination path length. In this manner, the overall physical footprint of the SXR based metrology system is small enough to be compatible with a high volume semiconductor manufacturing facility. In some embodiments, an illumination spot size is characterized by a lateral dimension of 40 micrometers or less. In some embodiments, an illumination spot size is characterized by a lateral dimension of 100 micrometers or less.

As depicted in FIG. 1, focusing optics 111 focuses source radiation onto a metrology target located on specimen 101. The finite lateral source dimension results in finite spot size 102 on the target defined by the rays coming from the edges of the source and any beam shaping provided by beam slits 112 and 113.

In some embodiments, the illumination optics subsystem includes at least one surface having reflective power. In some of these embodiments, a coating on the reflective surface is segmented into one or more regions. Each coating region is optimized for light throughput, a range of angles of incidence, and range of wavelengths.

In some embodiments, the illumination optics subsystem includes at least one surface having diffractive power. In some of these embodiments, the diffractive surface is segmented into one or more regions. Each region is optimized for light throughput, a range of angles of incidence, and range of wavelengths.

Figure 4:
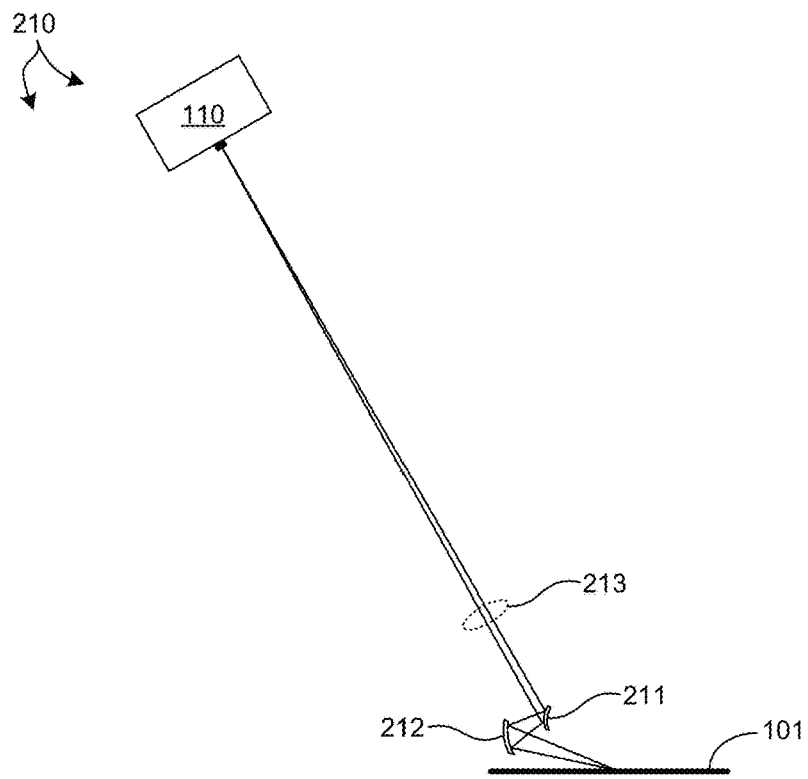
FIG. 4 depicts an illumination optics subsystem in one embodiment including two spherical mirrors.

FIG. 4 depicts an illumination optics subsystem 210 in one embodiment. As depicted in FIG. 4, illumination optics subsystem 210 includes a spherical reflective objective including reflective spherical optical element 211 and reflective spherical optical element 212 in an illumination optical path from illumination source 110 and wafer 101. The reflective spherical optical elements 211 and 212 are arranged in a Schwarzschild configuration. The reflective spherical optical elements 211 and 212 focus illumination light 213 onto wafer 101 with a demagnification factor of at least 1.25. Furthermore, the optical path length of illumination light 213 from illumination source 110 to wafer 101 is less than two meters.

The short path length and high demagnification minimizes the spread in illumination spot size due to light scattering from the surfaces of reflective spherical elements 211 and 212. The use of spherical reflective elements is advantageous due to the relative ease of manufacture of spherical surface forms. The use of two mirror surfaces, rather than one reflective surface, introduces additional photon intensity loss. However, the surface figure of a spherical surface is manufactured with highly randomized surface errors over a relatively large surface area. Thus, the mid-frequency errors and slope errors induced by the spherical reflective optical surfaces is relatively low. In preferred embodiments, reflective spherical elements 211 and 212 are arranged with a demagnification greater than 2.5. Arrangements with demagnification less than 2.5 are possible, but the size of the primary mirror becomes relatively large. In some embodiments, reflective spherical elements 211 and 212 are arranged with a demagnification of 4 to 12. In some embodiments, reflective spherical elements 211 and 212 are arranged with a demagnification of 30 to 40, or even greater.

Figure 5:
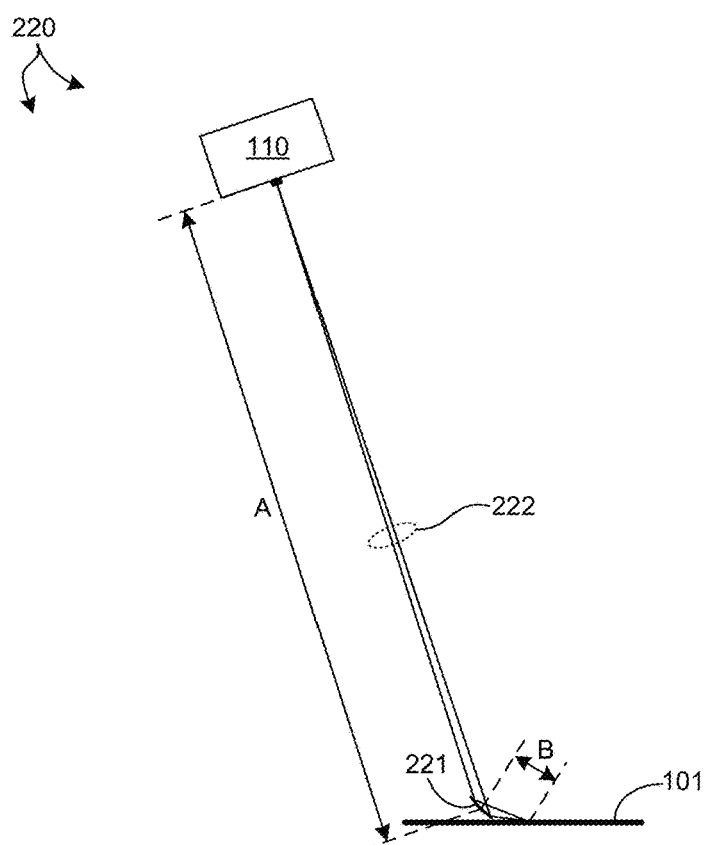
FIG. 5 depicts an illumination optics subsystem in one embodiment including an ellipsoidal mirror.

FIG. 5 depicts an illumination optics subsystem 220 in one embodiment. As depicted in FIG. 5, illumination optics subsystem 220 includes an ellipsoidal reflective optical element 221 in an illumination optical path from illumination source 110 and wafer 101. The reflective ellipsoidal optical element focuses illumination light 222 onto wafer 101 with a demagnification factor of at least 1.25. Furthermore, the optical path length of illumination light 222 from illumination source 110 to wafer 101 is less than two meters.

The short path length and high demagnification minimizes the spread in illumination spot size due to light scattering from the surfaces of reflective ellipsoidal element 221. The use of an ellipsoidal reflective element is advantageous due to the relative ease of manufacture of an ellipsoidal surface form, compared to more complex surface shapes. In addition, the use of one mirror surface minimizes photon intensity loss. Although mid-frequency and slope errors induced by the ellipsoidal reflective optical surface may be greater than a spherical surface, the overall optical performance compares favorably against more complex surface shapes with significantly less manufacturing effort. In preferred embodiments, reflective ellipsoidal element 221 is arranged with a demagnification greater than 1.25. In some embodiments, reflective ellipsoidal element 221 is arranged with a demagnification of 4 to 12. In some embodiments, reflective ellipsoidal element 221 is arranged with a demagnification of 30 to 40, or even greater. As the demagnification factor increases, the ratio of dimensions, A/B, also increases. The limitations of achievable demagnification are primarily driven by the limitations on illumination path length (less than 2 meters) and practical constraints on achievable values of the ratio of A/B.

Figure 6:
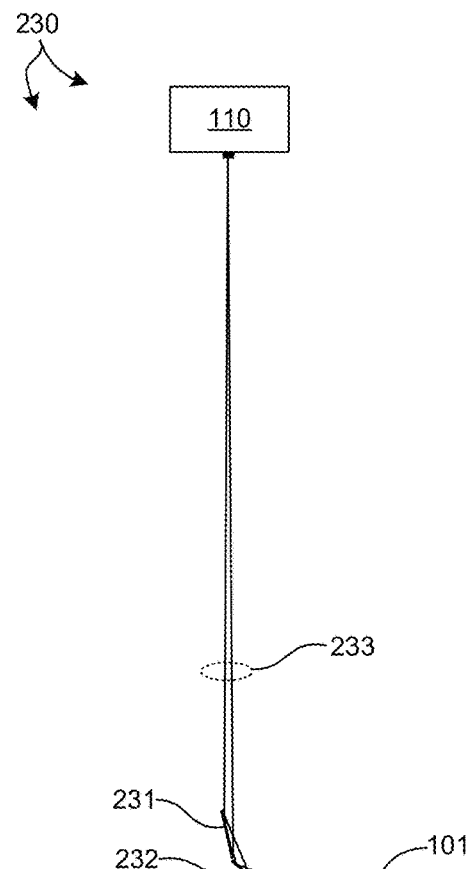
FIG. 6 depicts an illumination optics subsystem in one embodiment including a Wolter objective.

FIG. 6 depicts an illumination optics subsystem 230 in one embodiment. As depicted in FIG. 6, illumination optics subsystem 230 includes an elliptical reflective optical element 231 and reflective hyperbolic optical element 232 in an illumination optical path from illumination source 110 and wafer 101. The reflective optical elements 231 and 232 are arranged in a Wolter Type 1 configuration. The reflective optical elements 231 and 232 focus illumination light 233 onto wafer 101 with a demagnification factor of at least 1.25. Furthermore, the optical path length of illumination light 233 from illumination source 110 to wafer 101 is less than two meters.

As depicted in FIG. 6, hyperbolic mirror 232 is positioned such that the mathematical focal point of the hyperbolic shape coincides with the focal point of the ellipse. In this manner, the focal length of the optical subsystem is reduced by the hyperbolic mirror. The relatively short focal length is an advantage of the type 1 Wolter optics configuration. Although a type 1 Wolter configuration is depicted in FIG. 6, in general, any suitable Wolter configuration, e.g., type 2 or type 3 configuration is contemplated within the scope of this patent document. In a further embodiment, mirrors 231 and 232 are arranged as a set of nested, concentric shells. In these embodiments, the total aperture of the illumination subsystem is increased.

In preferred embodiments, reflective optical elements 231 and 232 are arranged with a demagnification greater than 1.25. In some embodiments, reflective optical elements 231 and 232 are arranged with a demagnification of 4 to 12. In some embodiments, reflective optical elements 231 and 232 are arranged with a demagnification of 30 to 40, or even greater.

Figure 7:
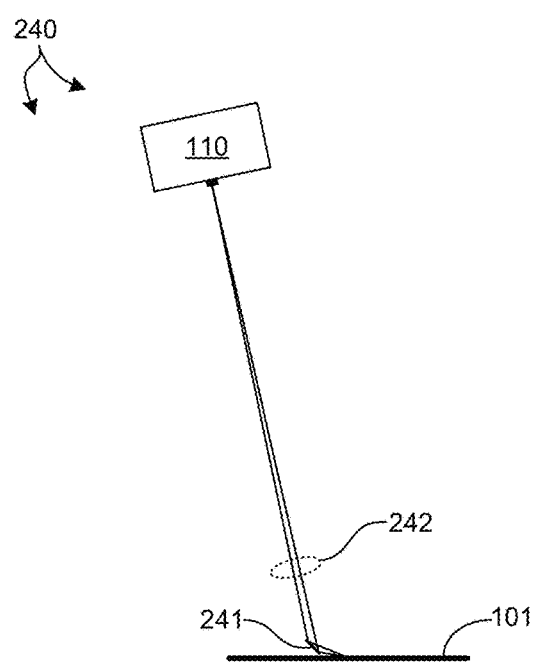
FIG. 7 depicts an illumination optics subsystem in one embodiment including a mirror having a freeform surface form.

FIG. 7 depicts an illumination optics subsystem 240 in one embodiment. As depicted in FIG. 7, illumination optics subsystem 240 includes a freeform reflective optical element 241 in an illumination optical path from illumination source 110 and wafer 101. The freeform reflective optical element focuses illumination light 242 onto wafer 101 with a demagnification factor of at least 1.25. Furthermore, the optical path length of illumination light 242 from illumination source 110 to wafer 101 is less than two meters.

The short path length and high demagnification minimizes the spread in illumination spot size due to light scattering from the surfaces of freeform reflective element 241. The use of one mirror surface minimizes photon intensity loss. The use of a freeform reflective element is advantageous due to better wavefront corrections enabling a smaller soft x-ray illumination spot on the target. Furthermore, the surface shape of reflective element 241 is fabricated to minimize mid-frequency and slope errors, albeit at a cost of greater manufacturing effort compared to a relatively simple elliptical shape. In preferred embodiments, freeform reflective element 241 is arranged with a demagnification greater than 1.25. In some embodiments, freeform reflective element 241 is arranged with a demagnification of 4 to 12. In some embodiments, freeform reflective element 241 is arranged with a demagnification of 30 to 40, or even greater.

Figure 8:
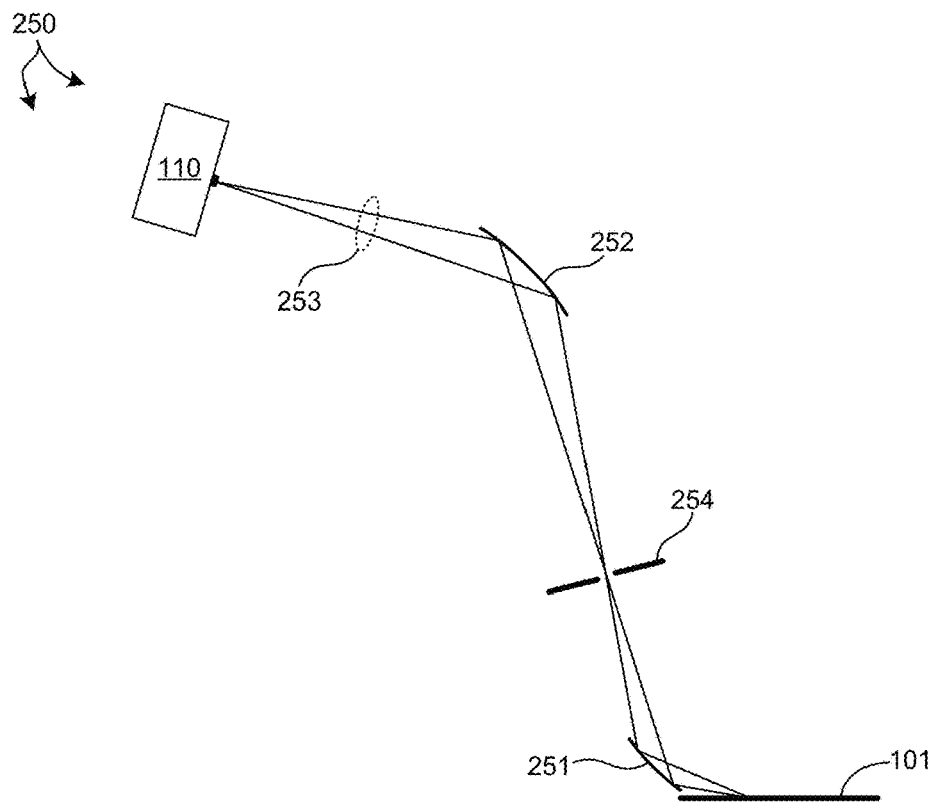
FIG. 8 depicts an illumination optics subsystem in one embodiment including an internal field stop.

FIG. 8 depicts an illumination optics subsystem 250 in one embodiment. In one aspect, illumination optics subsystem 250 includes an internal field stop 254 conjugate to the illumination source 110 and the specimen 101 under measurement. In some embodiments, the shape, size, or both, of internal field stop 254 is adjustable analogous to beam slit 112.

As depicted in FIG. 8, illumination optics subsystem 250 includes focusing reflective optical elements 251 and 252 in an illumination optical path from illumination source 110 and wafer 101. Moreover, an internal field stop 254 is located in the illumination optical path between focusing reflective optical elements 251 and 252. Furthermore, the internal field stop 254 is conjugate to the illumination source 110 and wafer 101. The embodiment depicted in FIG. 8 includes two mirrors, however, in general, the illumination subsystem 250 may include more than two mirrors and at least one internal field stop. The focusing reflective optical elements 251 and 252 focus illumination light 253 onto wafer 101 with a demagnification factor of at least 1.25. Furthermore, the optical path length of illumination light 253 from illumination source 110 to wafer 101 is less than two meters. In preferred embodiments, focusing reflective optical elements 251 and 252 are arranged with a demagnification greater than 1.25. In some embodiments, focusing reflective optical elements 251 and 252 are arranged with a demagnification of 4 to 12. In some embodiments, focusing reflective optical elements 251 and 252 are arranged with a demagnification of 30 to 40, or even greater.

In another aspect, an internal field stop of an illumination subsystem is tilt shifted with respect to the specimen under measurement to minimize the size of the illumination spot projected onto the specimen under measurement.

Figure 9:
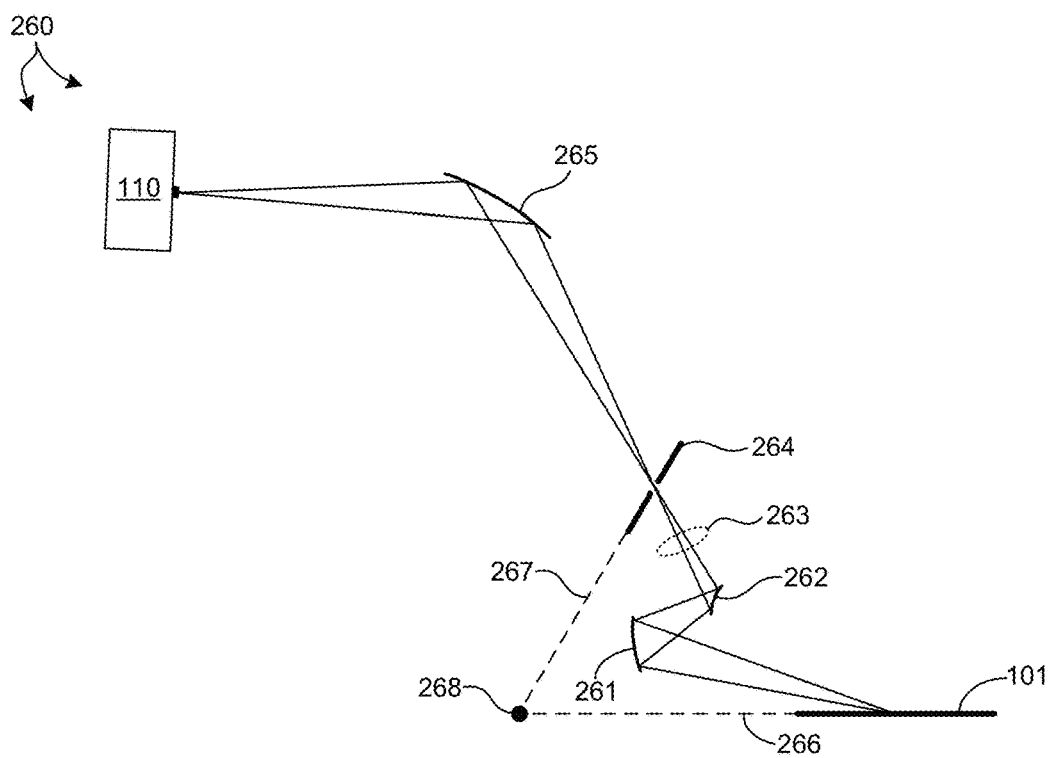
FIG. 9 depicts an illumination optics subsystem in one embodiment including a tilt shift.

In one embodiment, as depicted in FIG. 9, internal field stop 264 is tilt shifted with respect to wafer 101 to minimize the size of the illumination spot projected onto the surface of wafer 101. Reflective optical elements 261 and 262 are arranged with respect to field stop 264 and wafer 101 in accordance with the Scheimpflug condition. In some embodiments, the shape, size, or both, of internal field stop 264 is adjustable analogous to beam slit 112.

In another aspect, as described in FIG. 9, the illumination source 110 of an illumination subsystem is tilt shifted with respect to the wafer 101 to minimize the size of the illumination spot projected onto the surface of wafer 101. Reflective optical element 265 is arranged with respect to illumination source 110 and wafer 101 in accordance with the Scheimpflug condition.

In one embodiment, as depicted in FIG. 9, illumination source 110 is tilt shifted with respect to wafer 101 to minimize the size of the illumination spot projected onto the surface of wafer 101. Reflective optical elements 265, 261 and 262 are arranged with respect to illumination source 110 and wafer 101 in accordance with the Scheimpflug condition. In this manner, illumination source 110 is tilt shifted with respect to wafer 101, but the plane of focus of the illumination subsystem is aligned with the surface of wafer 101. As a result, illumination light 263 is in focus across the entire area of the illuminated area on the surface of wafer 101.

FIG. 9 depicts an illumination subsystem 260 having an illumination aperture (e.g., illumination slit 264) oriented at an oblique angle with respect to the optical axis of the beam of illumination light 263 entering the reflective objective including reflective elements 261 and 262. In some embodiments, illumination aperture 264 is oriented such that the image plane 267 of illumination aperture 264, the principal plane of the objective comprising reflective elements 261 and 262, and the surface plane 266 of specimen 101 intersect along a common line 268. This configuration satisfies the Scheimpflug condition. The Scheimpflug condition identifies that if either the object plane (e.g., surface of specimen 101) or the image plane (e.g., image plane of illumination aperture 264 is tilted with respect to one another, the distances of both the object and image to the principal plane of the imaging system (e.g., objective comprising reflective elements 261 and 262) need to change depending on the object height to satisfy the geometrical image condition for all field heights. As depicted in FIG. 9, with the orientation of the image plane of illumination aperture 264 satisfying the Scheimpflug condition, the illumination aperture is imaged onto the surface of specimen 101 without blur (i.e., in focus over the entire field). This results in an effective decrease in illumination spot size.

In general, the illumination subsystem of a soft x-ray based metrology system as described herein may employ one or more mirrors. In some embodiments, at least one mirror includes an aspheric surface. In some embodiments, at least one mirror includes a freeform surface.

In some embodiments, the illumination optics subsystem includes an illumination pupil aperture. In some of these embodiments, the illumination pupil aperture (e.g., illumination pupil aperture 113) is adjustable in position and size to enhance tool-to-tool hardware matching, optimize measurement fidelity, optimize light throughput for different specimens under measurement, minimize diffraction order cross-talk, or any combination thereof. In some of these embodiments, computing system 130 communicates control commands to the illumination pupil aperture subsystem. One or more actuators of the illumination pupil aperture subsystem changes the size, shape, or both of the illumination pupil aperture structure in response to the control commands to achieve a desired size, shape, or both of the illumination pupil aperture.

In some embodiments, the illumination optics subsystem includes an illumination field aperture. In some of these embodiments, the illumination field aperture (e.g., illumination field aperture 112, 254, or 264) is adjustable in position and size to enhance tool-to-tool hardware matching, optimize measurement fidelity, optimize light throughput for different specimens under measurement, minimize diffraction order cross-talk, or any combination thereof. In some of these embodiments, computing system 130 communicates control commands to the illumination field aperture subsystem. One or more actuators of the illumination field aperture subsystem changes the size, shape, or both of the illumination field aperture structure in response to the control commands to achieve a desired size, shape, or both of the illumination field aperture.

Figure 10:
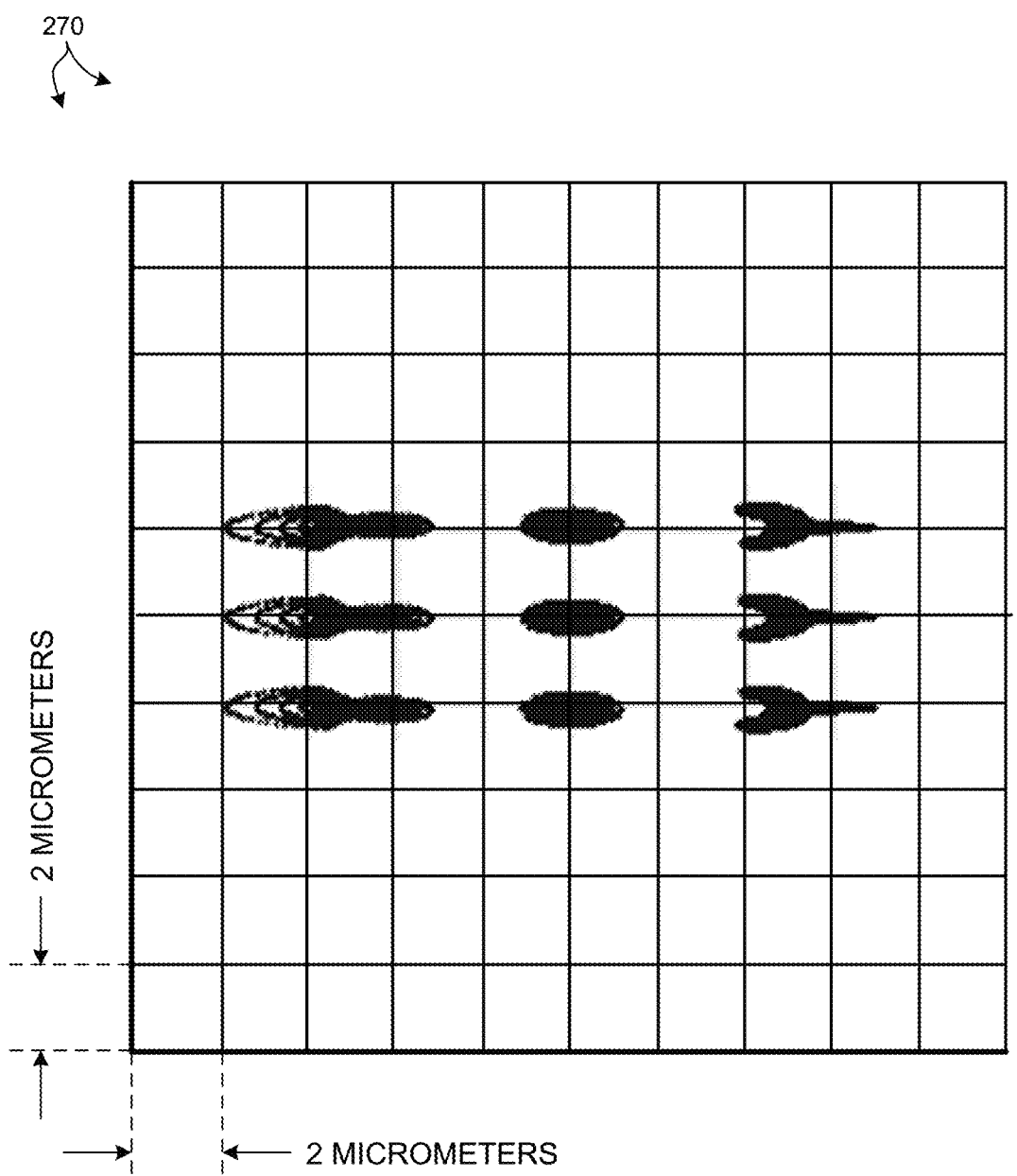
FIG. 10 depicts a plot 270 illustrative of a simulation of the shape and size of an illumination spot projected onto a specimen under measurement from an illumination source size of 50 micrometer by 50 micrometer full width, half maximum intensity by an illumination subsystem as described herein.

FIG. 10 depicts a plot 270 illustrative of a simulation of the shape and size of an illumination spot projected onto a specimen under measurement from an illumination source size of 50 micrometer by 50 micrometer full width, half maximum intensity by an illumination subsystem as described herein. As illustrated in FIG. 10, and exemplary illumination spot size at the wafer is less than 20 micrometers by 20 micrometers, indicating a demagnification of at least 2.5.

In some embodiments, an illumination optics subsystem includes a filter that transmits illumination light in a desired spectral band (e.g., soft x-ray light) and blocks radiation in an undesired spectral band (e.g., ultra-violet, visible, infrared light, or any combination thereof).

In a further aspect, the illumination optics subsystem (e.g., focusing optical element 111 depicted in FIG. 1) collects source emission and selects one or more discrete wavelengths or spectral bands, and focuses the selected light onto specimen 101 at a desired nominal grazing angle of incidence.

The nominal grazing incidence angle is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility SXR measurements probe more deeply into the structure with less sensitivity to the precise value of the grazing incidence angle.

In some embodiments, an illumination optics subsystem is configured to direct the amount of illumination light from the illumination source to a measurement spot on a surface of a specimen under measurement at a nominal grazing angle of incidence within a range of 0 to 30 degrees. In some embodiments, the illumination optics subsystem is configured to direct the amount of illumination light from the illumination source to a measurement spot on a surface of a specimen under measurement at a nominal grazing angle of incidence within a range of 10 to 20 degrees.

In some embodiments, the illumination optics subsystem (e.g., focusing optical element 111 depicted in FIG. 1) includes graded multi-layer coatings that select desired wavelengths or ranges of wavelengths for projection onto specimen 101. In some examples, focusing optics 111 includes a graded multi-layer coating structure that selects one wavelength and projects the selected wavelength onto specimen 101 over a range of angles of incidence. In some examples, focusing optics 111 includes a graded multi-layer coating structure that selects a range of wavelengths and projects the selected wavelengths onto specimen 101 over one angle of incidence. In some examples, focusing optics 111 includes a graded multi-layer coating structure that selects a range of wavelengths and projects the selected wavelengths onto specimen 101 over a range of angles of incidence.

Graded multi-layered optics are preferred to maximize light throughput. In general, multi-layer optics select reflected wavelengths. The spectral bandwidth of the selected wavelengths optimizes flux provided to specimen 101, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LSP laser tuning, etc.)

In some other examples, little to no prior structural information is available at the time of measurement. In these examples, multiple wavelengths (e.g., 3-4) are selected to enable measurement of diffraction patterns across the absorption edge. The measured signals enable model-free measurement of structural properties with no prior information except the elemental composition of the structures under measurement using, for example, multiple wavelength anomalous diffraction techniques. After estimating structural properties based on model-free measurements, parameter estimates may be further refined using model-based measurement techniques.

In some examples, the anomalous scattering factors (i.e., scattering properties) of the metrology target under measurement are not known a priori. In these examples, film multilayer reflectivity is measured at multiple resonant wavelengths. Angular excursions of Bragg peaks provide sufficient information to extract the anomalous scattering factors.

In some examples, non-resonant x-ray reflectivity measurements provide independent estimates of multilayer period and interface roughness parameters, which improve the fitting of model-based measurements. In some embodiments, a combined metrology tool includes a multiple wavelength SXR diffraction subsystem as described herein and an x-ray reflectometry subsystem to improve measurement throughput. In one embodiment, the multiple wavelength SXR diffraction subsystem and the x-ray reflectometry subsystem employ orthogonal planes of incidence that enable simultaneous measurements or sequential measurements without having to move the specimen under measurement or either of the optical measurement subsystems. In some embodiments, wafer rotation, detector rotation, or both, may be employed to extend the range of angles of incidence if the AOI range provided by the SXR multilayer mirrors is too small for x-ray reflectometry.

In some embodiments, focusing optics 111 include a plurality of reflective optical elements each having an elliptical surface shape. Each reflective optical element includes a substrate and a multi-layer coating tuned to reflect a different wavelength or range of wavelengths. In some embodiments, a plurality of reflective optical elements (e.g., 1-5) each reflecting a different wavelength or range of wavelengths are arranged at each angle of incidence. In a further embodiment, multiple sets (e.g., 2-5) of reflective optical elements each reflecting a different wavelength or range of wavelengths are arranged each at set at a different angle of incidence. In some embodiments, the multiple sets of reflective optical elements simultaneously project illumination light onto specimen 101 during measurement. In some other embodiments, the multiple sets of reflective optical elements sequentially project illumination light onto specimen 101 during measurement. In these embodiments, active shutters or apertures are employed to control the illumination light projected onto specimen 101.

Figure 2:
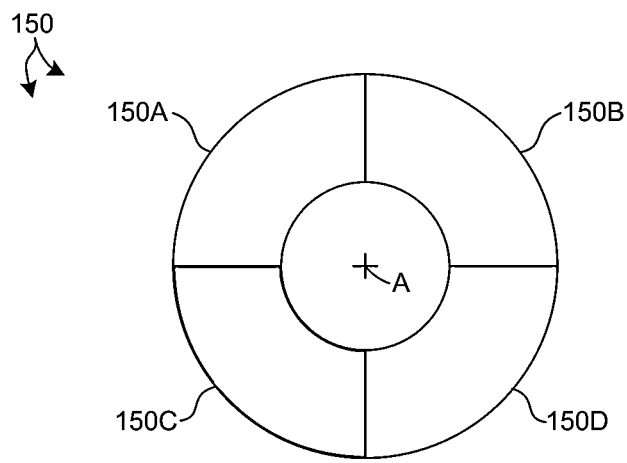
FIG. 2 is a simplified diagram illustrative of an end view of focusing optics including four mirror elements disposed around the beam axis, A, in a segmented configuration.

In some embodiments, focusing optics 111 focus light at multiple wavelengths, azimuths and AOI on the same metrology target area. FIG. 2 depicts an end view (i.e., along the beam axis) of focusing optics 150 including four mirror elements 150A-150D disposed around the beam axis, A, in a segmented configuration. Each mirror element includes a multi-layer coating tuned to reflect a different wavelength or range of wavelengths. In some embodiments, each mirror element 150A-D includes a uniform multilayer design (i.e., the surface of a particular mirror element reflects the same wavelength or range of wavelengths over the entire mirror surface area of that particular mirror element). In some other embodiments, each mirror element includes a non-uniform multilayer design (i.e., the wavelength or range of wavelengths reflected by the mirror element depends on the location of incidence on the mirror surface). In some of these embodiments, each mirror element is elliptical in shape and projects illumination light to specimen 101 over a range of angles of incidence. Although, FIG. 2 depicts four mirror elements, in general, focusing optics may include any number of mirror elements arranged to focus light at multiple wavelengths, azimuths and AOI on the same metrology target area. In some other embodiments, focusing optics includes a number of mirror elements nested in the plane of incidence (i.e., a nested Wolter configuration).

In some examples, the x-ray optics collimate or focus the x-ray beam onto measurement area 102 of specimen 101 to less than 1 milliradian divergence using multilayer x-ray optics.

In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as spherical mirrors, ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

In a further aspect, the ranges of wavelengths, AOI, Azimuth, or any combination thereof, projected onto the same metrology area simultaneously, sequentially, or a combination thereof, are adjusted by actively positioning one or more mirror elements of the focusing optics. As depicted in FIG. 1, computing system 130 communicates command signals 137 to actuator system 115 that causes actuator system 115 to adjust the position, alignment, or both, of one or more of the optical elements of focusing optics 111 to achieve the desired ranges of wavelengths, AOI, Azimuth, or any combination thereof, projected onto specimen 101.

In general, an angle of incidence or range of angles of incidence is selected for each wavelength to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In a further aspect, an SXR based metrology system (e.g., metrology tool 100) includes one or more beam slits or apertures to shape the illumination beam 114 incident on specimen 101 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

In another further aspect, an SXR based metrology system (e.g., metrology tool 100) includes one or more beam slits or apertures to select a set of illumination wavelengths that simultaneously illuminate a metrology target under measurement. In some embodiments, illumination including multiple wavelengths is simultaneously incident on a metrology target under measurement. In these embodiments, one or more slits are configured to pass illumination including multiple illumination wavelengths. In general, simultaneous illumination of a metrology target under measurement is preferred to increase signal information and throughput. However, in practice, overlap of diffraction orders at the detector limits the range of illumination wavelengths. In some embodiments, one or more slits are configured to sequentially pass different illumination wavelengths. In some examples, sequential illumination at larger angular divergence provides higher throughput because the signal to noise ratio for sequential illumination may be higher compared to simultaneous illumination when beam divergence is larger. When measurements are performed sequentially the problem of overlap of diffraction orders is not an issue. This increases measurement flexibility and improves signal to noise ratio.

FIG. 1 depicts beam control slits 112 and 113 located in the beam path between focusing optics 111 and wafer 101. In one embodiment, beam control slit 112 is an adjustable field aperture employed to control the size and shape of the illumination spot on wafer 101. In addition, beam control slit 113 is an adjustable pupil aperture employed to control the numerical aperture of the illumination spot on wafer 101. In some embodiments, beam control slit 112 selects the illumination wavelength(s) of incident beam 114. In one aspect, the slits of beam shaping slit 113 are located in close proximity to specimen 101 to minimize the enlargement of the incident beam spot size due to beam divergence.

In some embodiments, beam shaping slit 112 includes multiple, independently actuated beam shaping slits. In one embodiment, beam shaping slit 112 includes four independently actuated beam shaping slits. These four beams shaping slits effectively block a portion of the incoming beam and generate an illumination beam 114 having a box shaped illumination cross-section.

Slits of beam shaping slit 112 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit.

In a further aspect, a SXR based metrology system (e.g., metrology tool 100) includes a collection optics subsystem including a collection pupil aperture. In some embodiments, the collection pupil aperture is adjustable in position and size to enhance tool-to-tool hardware matching, optimize measurement fidelity, and optimize light throughput for different specimens under measurement.

In another further aspect, a SXR based metrology system includes an X-ray detector. As depicted in FIG. 1, X-ray detector 119 collects x-ray radiation 118 scattered from specimen 101 and generates output signals 135 indicative of properties of specimen 101 that are sensitive to the incident x-ray radiation in accordance with a SXR based measurement modality. In some embodiments, scattered x-rays 118 are collected by x-ray detector 119 while specimen positioning system 140 locates and orients specimen 101 to produce angularly resolved scattered x-rays.

In some embodiments, an SXR based metrology system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

In a further aspect, an SXR based metrology system is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals.

In some examples, metrology based on SXR illumination involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

It is desirable to perform measurements at large ranges of wavelength, angle of incidence and azimuth angle to increase the precision and accuracy of measured parameter values. This approach reduces correlations among parameters by extending the number and diversity of data sets available for analysis.

Measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

Figure 3:
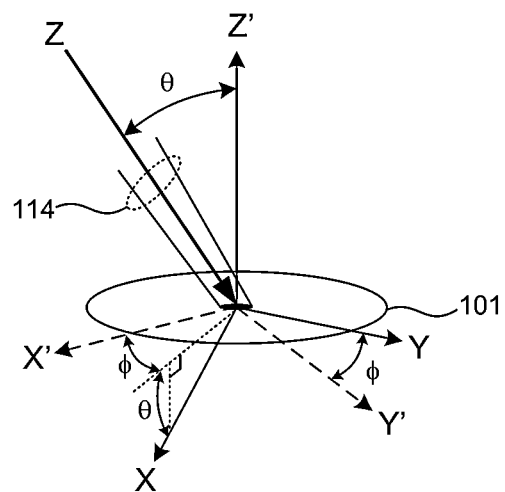
FIG. 3 depicts x-ray illumination beam incident on a wafer at a particular orientation described by an angle of incidence, $\theta$, and an azimuth angle, $\phi$.

Each orientation of the illuminating x-ray beam 114 relative to the surface normal of a semiconductor wafer 101 is described by any two angular rotations of wafer 101 with respect to the x-ray illumination beam 114, or vice-versa. In one example, the orientation can be described with respect to a coordinate system fixed to the wafer. FIG. 3 depicts x-ray illumination beam 114 incident on wafer 101 at a particular orientation described by an angle of incidence, θ, and an azimuth angle, φ. Coordinate frame XYZ is fixed to the metrology system (e.g., illumination beam 114) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 3, x-ray illumination beam 114 is aligned with the Z-axis and thus lies within the XZ plane. Angle of incidence, θ, describes the orientation of the x-ray illumination beam 114 with respect to the surface normal of the wafer in the XZ plane. Furthermore, azimuth angle, φ, describes the orientation of the XZ plane with respect to the X'Z' plane. Together, θ and φ, uniquely define the orientation of the x-ray illumination beam 114 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

In another aspect, metrology tool 100 includes a wafer chuck 103 that fixedly supports wafer 101 and is coupled to specimen positioning system 140. Specimen positioning system 140 configured to actively position specimen 101 in six degrees of freedom with respect to illumination beam 114. In one example, computing system 130 communicates command signals (not shown) to specimen positioning system 140 that indicate the desired position of specimen 101. In response, specimen positioning system 140 generates command signals to the various actuators of specimen positioning system 140 to achieve the desired positioning of specimen 101.

SXR enables overlay measurements on design-rule targets because the illumination wavelength(s) are shorter than the period of the measured structures. This provides a significant benefit over existing technology where overlay is measured on larger than the design rule targets. Use of SXR wavelengths permits target design at process design rules, i.e., no "non-zero offsets".

An overlay metrology target for SXR based measurements may include one dimensional periodic array or two dimensional periodic arrays. One dimensional targets exhibit large angular divergence along the plane of incidence, increasing flux and throughput. For two dimensional targets angular dispersion of diffraction is not equivalent for the two in-plane axes. Thus, for sample directions parallel to the plane of incidence, an additional, super-period may be imposed. In these examples, it may be advantageous to rotate the wafer and perform sequential, orthogonal measurements by a single subsystem on the same target.

In another further aspect, an overlay metrology target for SXR based measurements may be employed to measure both overlay and critical dimensions. This also enables measurements of Edge Placement Errors (EPE), such as end line shortening, line to contact distance, etc.

In some embodiments, x-ray illumination source 110, focusing optics 111, slits 112 and 113, or any combination thereof, are maintained in the same atmospheric environment as specimen 101 (e.g., gas purge environment). However, in some embodiments, x-ray scattering in air contributes noise to the image on the detector. Hence in some embodiments, any of x-ray illumination source 110, focusing optics 111, and slits 112 and 113 are maintained in a localized, vacuum environment. In some embodiments, illumination source 110, focusing optics 111, and slits 112 and 113 are maintained in a controlled environment (e.g., vacuum) within an evacuated flight tube. The illumination beam 114 passes through window at the end of flight tube before incidence with specimen 101.

Similarly, in some embodiments, the optical path length between specimen 101 and detector 119 (i.e., the collection beam path) is long and x-ray scattering in air contributes noise to the image on the detector. Hence, in preferred embodiments, a significant portion of the collection beam path length between specimen 101 and detector 119 is maintained in a localized vacuum environment separated from the specimen (e.g., specimen 101) by a vacuum window (e.g., vacuum window 124). In some embodiments, x-ray detector 119 is maintained in the same localized vacuum environment as the beam path length between specimen 101 and detector 119. For example, as depicted in FIG. 1, vacuum chamber 123 maintains a localized vacuum environment surrounding detector 119 and a significant portion of the beam path length between specimen 101 and detector 119.

In some other embodiments, x-ray detector 119 is maintained in the same atmospheric environment as specimen 101 (e.g., gas purge environment). This may be advantageous to remove heat from detector 119. However, in these embodiments, it is preferable to maintain a significant portion of the beam path length between specimen 101 and detector 119 in a localized vacuum environment within a vacuum chamber.

In some embodiments, the entire optical system, including specimen 101, is maintained in vacuum. However, in general, the costs associated with maintaining specimen 101 in vacuum are high due to the complexities associated with the construction of specimen positioning system 140.

In another further aspect, computing system 130 is configured to generate a structural model (e.g., geometric model, material model, or combined geometric and material model) of a measured structure of a specimen, generate a SXR response model that includes at least one geometric parameter from the structural model, and resolve at least one specimen parameter value by performing a fitting analysis of SXR measurement data with the SXR response model. The analysis engine is used to compare the simulated SXR signals with measured data thereby allowing the determination of geometric as well as material properties such as electron density of the sample. In the embodiment depicted in FIG. 1, computing system 130 is configured as a model building and analysis engine configured to implement model building and analysis functionality as described herein.

Figure 11:
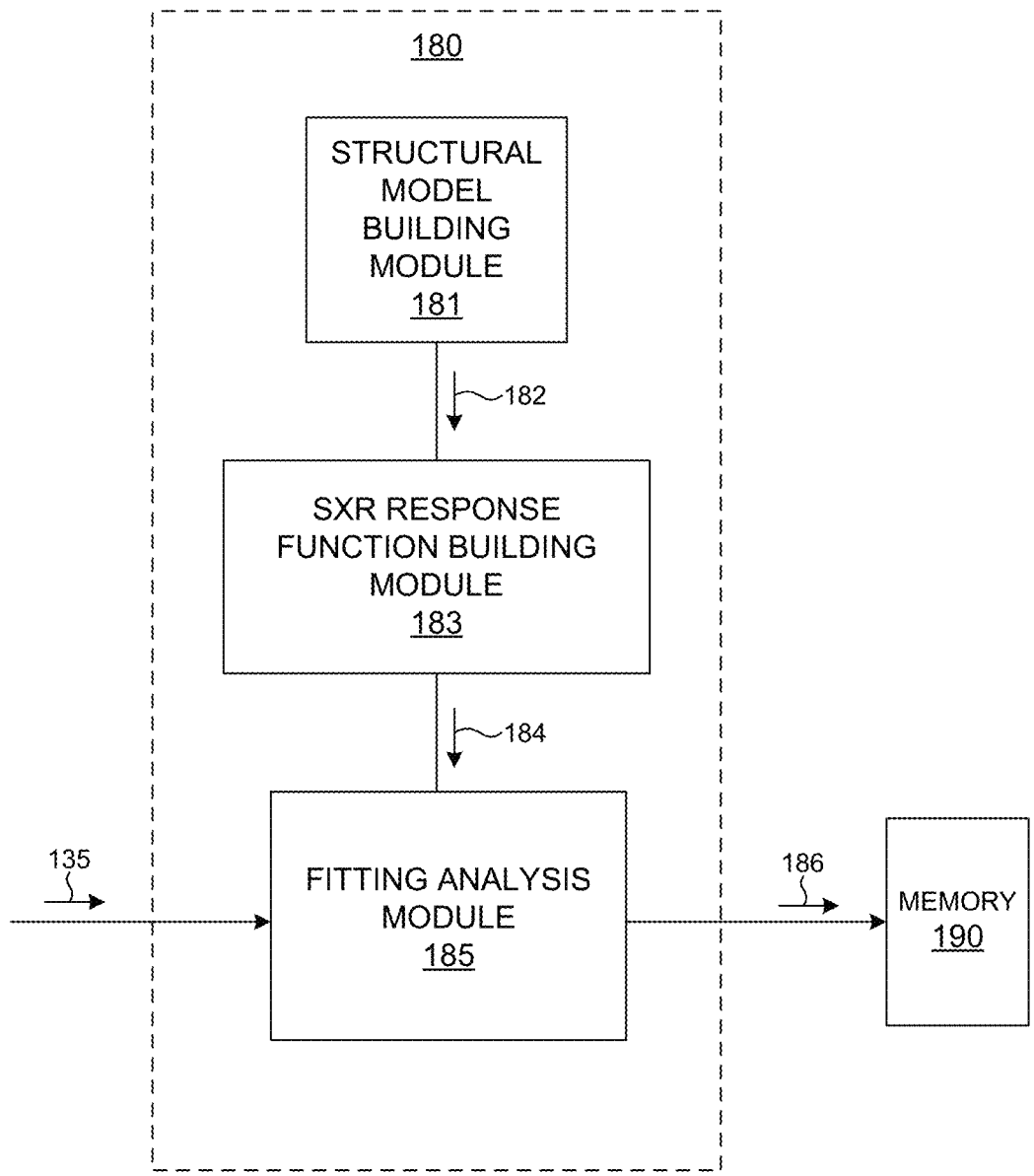
FIG. 11 is a simplified diagram illustrative of an exemplary model building and analysis engine.

FIG. 11 is a diagram illustrative of an exemplary model building and analysis engine 180 implemented by computing system 130. As depicted in FIG. 11, model building and analysis engine 180 includes a structural model building module 181 that generates a structural model 182 of a measured structure of a specimen. In some embodiments, structural model 182 also includes material properties of the specimen. The structural model 182 is received as input to SXR response function building module 183. SXR response function building module 183 generates a SXR response function model 184 based at least in part on the structural model 182. In some examples, the SXR response function model 184 is based on x-ray form factors, also known as structure factors, $$F(\vec{q}) = \int \rho(\vec{r}) e^{-i\vec{q}\cdot\vec{r}} d\vec{r} \tag{1}$$

where F is the form factor, q is the scattering vector, and $\rho(r)$ is the electron density of the specimen in spherical coordinates. The x-ray scattering intensity is then given by $$I(\vec{q}) = F^*F. \tag{2}$$

SXR response function model 184 is received as input to fitting analysis module 185. The fitting analysis module 185 compares the modeled SXR response with the corresponding measured data to determine geometric as well as material properties of the specimen.

In some examples, the fitting of modeled data to experimental data is achieved by minimizing a chi-squared value. For example, for SXR based measurements, a chi-squared value can be defined as $$\chi^2_{SAXS} = \frac{1}{N_{SAXS}} \sum_j^{N_{SAXS}} \frac{\left(S_j^{SAXS\ model}(v_1, \ldots, v_L) - S_j^{SAXS\ experiment}\right)^2}{\sigma^2_{SAXS,j}} \tag{3}$$

Where, $S_j^{SAXS\ experiment}$ is the measured SXR signals 126 in the "channel" j, where the index j describes a set of system parameters such as diffraction order, energy, angular coordinate, etc. $S_j^{SAXS\ model}(v_1, \ldots, v_L)$ is the modeled SXR signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (3) assumes that the uncertainties associated with different channels are uncorrelated. In examples where the uncertainties associated with the different channels are correlated, a covariance between the uncertainties, can be calculated. In these examples a chi-squared value for SXR based measurements can be expressed as $$\chi^2_{SAXS} = \frac{1}{N_{SAXS}} \left(\vec{S}_j^{SAXS.\ model}(v_1, \ldots, v_M) - \vec{S}_j^{SAXS.\ experiment}\right)^T \tag{4}$$
$$V_{SAXS}^{-1} \left(\vec{S}_j^{SAXS.\ model}(v_1, \ldots, v_M) - \vec{S}_j^{SAXS.\ experiment}\right)$$

where, $V_{SAXS}$ is the covariance matrix of the SAXS channel uncertainties, and T denotes the transpose.

In some examples, fitting analysis module 185 resolves at least one specimen parameter value by performing a fitting analysis on SXR measurement data 135 with the SXR response model 184. In some examples, $\chi_{SAXS}^2$ is optimized.

As described hereinbefore, the fitting of SXR data is achieved by minimization of chi-squared values. However, in general, the fitting of SXR data may be achieved by other functions.

The fitting of SXR metrology data is advantageous for any type of SXR technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing SXR beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 180 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In another further aspect, an initial estimate of values of one or more parameters of interest is determined based on SXR measurements performed at a single orientation of the incident x-ray beam with respect to the measurement target. The initial, estimated values are implemented as the starting values of the parameters of interest for a regression of the measurement model with measurement data collected from SXR measurements at multiple orientations. In this manner, a close estimate of a parameter of interest is determined with a relatively small amount of computational effort, and by implementing this close estimate as the starting point for a regression over a much larger data set, a refined estimate of the parameter of interest is obtained with less overall computational effort.

In another aspect, metrology tool 100 includes a computing system (e.g., computing system 130) configured to implement beam control functionality as described herein. In the embodiment depicted in FIG. 1, computing system 130 is configured as a beam controller operable to control any of the illumination properties such as intensity, divergence, spot size, polarization, spectrum, and positioning of the incident illumination beam 114.

As illustrated in FIG. 1, computing system 130 is communicatively coupled to detector 119. Computing system 130 is configured to receive measurement data 135 from detector 119. In one example, measurement data 135 includes an indication of the measured response of the specimen (i.e., intensities of the diffraction orders). Based on the distribution of the measured response on the surface of detector 119, the location and area of incidence of illumination beam 114 on specimen 101 is determined by computing system 130. In one example, pattern recognition techniques are applied by computing system 130 to determine the location and area of incidence of illumination beam 114 on specimen 101 based on measurement data 135. In some examples, computing system 130 communicates command signals 136 to x-ray illumination source 110 to select the desired illumination wavelength. In some examples, computing system 130 communicates command signals 137 to actuator subsystem 115 to redirect the x-ray emission to achieve a desired beam direction. In some examples, computing system 130 communicates command signals 138 and 139 to beam shaping slits 112 and 113, respectively, that cause beam shaping slits 112 and 113 to change the beam spot size, numerical aperture, and select illumination wavelengths such that incident illumination beam 114 arrives at specimen 101 with the desired beam spot size, orientation, and wavelength(s). In one example, command signals 138 and 139 cause actuators associated with slits 112 and 113 to change position to reshape the incident beam 114 to a desired shape and size and select desired wavelengths. In some other examples, computing system 130 communicates a command signal to wafer positioning system 140 to position and orient specimen 101 such that incident illumination beam 114 arrives at the desired location and angular orientation with respect to specimen 101.

In a further aspect, SXR measurement data is used to generate an image of a measured structure based on the measured intensities of the detected diffraction orders. In some embodiments, a SXR response function model is generalized to describe the scattering from a generic electron density mesh. Matching this model to the measured signals, while constraining the modelled electron densities in this mesh to enforce continuity and sparse edges, provides a three dimensional image of the sample.

Although, geometric, model-based, parametric inversion is preferred for critical dimension (CD) metrology based on SXR measurements, a map of the specimen generated from the same SXR measurement data is useful to identify and correct model errors when the measured specimen deviates from the assumptions of the geometric model.

In some examples, the image is compared to structural characteristics estimated by a geometric, model-based parametric inversion of the same scatterometry measurement data. Discrepancies are used to update the geometric model of the measured structure and improve measurement performance. The ability to converge on an accurate parametric measurement model is particularly important when measuring integrated circuits to control, monitor, and trouble-shoot their manufacturing process.

In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. In some examples, one or more parameters of interest, such as critical dimension (CD), sidewall angle (SWA), overlay, edge placement error, pitch walk, etc., are estimated directly from the resulting map. In some other examples, the map is useful for debugging the wafer process when the sample geometry or materials deviate outside the range of expected values contemplated by a parametric structural model employed for model-based CD measurement. In one example, the differences between the map and a rendering of the structure predicted by the parametric structural model according to its measured parameters are used to update the parametric structural model and improve its measurement performance. Further details are described in U.S. Patent Publication No. 2015/0300965, the content of which is incorporated herein by reference it its entirety. Additional details are described in U.S. Patent Publication No. 2015/0117610, the content of which is incorporated herein by reference it its entirety.

In a further aspect, model building and analysis engine 180 is employed to generate models for combined x-ray and optical measurement analysis. In some examples, optical simulations are based on, e.g., rigorous coupled-wave analysis (RCWA) where Maxwell's equations are solved to calculate optical signals such as reflectivities for different polarizations, ellipsometric parameters, phase change, etc.

Values of one or more parameters of interest are determined based on a combined fitting analysis of the detected intensities of the SXR diffraction orders at the plurality of different angles of incidence and detected optical intensities with a combined, geometrically parameterized response model. The optical intensities are measured by an optical metrology tool that may or may not be mechanically integrated with an SXR based metrology system, such as systems 100 depicted in FIG. 1. Further details are described in U.S. Patent Publication No. 2014/0019097 and U.S. Patent Publication No. 2013/0304424, the contents of each are incorporated herein by reference it their entirety.

In some embodiments, one or more parameters of interest are determined based on a combined fitting analysis of the measured signals associated with multiple measurement modalities. For example, SXR based measurements may be combined with spectroscopic ellipsometry (SE) based measurements, spectroscopic reflectometry (SR) measurements, or any combination thereof. In some examples, SXR based measurements may be combined with hard X-ray measurements. In some examples, SXR based measurements may be combined with spectroscopic measurements associated with multiple optical measurement modalities such as Mueller Matrix SE, Mueller Matrix SR, rotating compensator, rotating compensator (RCRC) SE, rotating polarizer, rotating compensator (RPRC) SE, rotating polarizer SE, rotating compensator SE, or any combination thereof. In some examples, SXR based measurements may be combined with spectroscopic measurements associated with optical SE measurements performed with illumination light in a spectral band ranging from vacuum ultraviolet (VUV) to near infrared (NIR), optical SR measurements performed with illumination light in a spectral band ranging from vacuum ultraviolet (VUV) to near infrared (NIR), or any combination thereof. In some embodiments, SXR based measurements are performed simultaneously with optical SE measurements, optical SR measurements, or both. In some other embodiments, SXR based measurements are performed sequentially with optical SE measurements, optical SR measurements, or both. In some embodiments, SXR based measurements are combined with Fourier Transform Infrared (FTIR) spectroscopic measurements. In some embodiments, SXR based measurements are combined with Hyperspectral Imaging (HSI) based measurements.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the x-ray illumination source 110, beam shaping slits 112 and 113, focusing optics actuator system 115, specimen positioning system 140, and detector 119 in any manner known in the art. For example, the one or more computing systems 130 may be coupled to computing systems associated with the x-ray illumination source 110, beam shaping slits 112 and 113, focusing optics actuator system 115, specimen positioning system 140, and detector 119, respectively. In another example, any of the x-ray illumination source 110, beam shaping slits 112 and 113, focusing optics actuator system 115, specimen positioning system 140, and detector 119 may be controlled directly by a single computer system coupled to computer system 130.

The computer system 130 may be configured to receive and/or acquire data or information from the subsystems of the system (e.g., x-ray illumination source 110, beam shaping slits 112 and 113, focusing optics actuator system 115, specimen positioning system 140, detector 119, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 135) from a storage medium (i.e., memory 132 or 190) via a data link. For instance, spectral results obtained using detector 119 may be stored in a permanent or semi-permanent memory device (e.g., memory 132 or 190). In this regard, the measurement results may be imported from on-board memory or from an external memory system. Moreover, the computer system 130 may send data to other systems via a transmission medium. For instance, specimen parameter values 186 determined by computer system 130 may be stored in a permanent or semi-permanent memory device (e.g., memory 190). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 12:
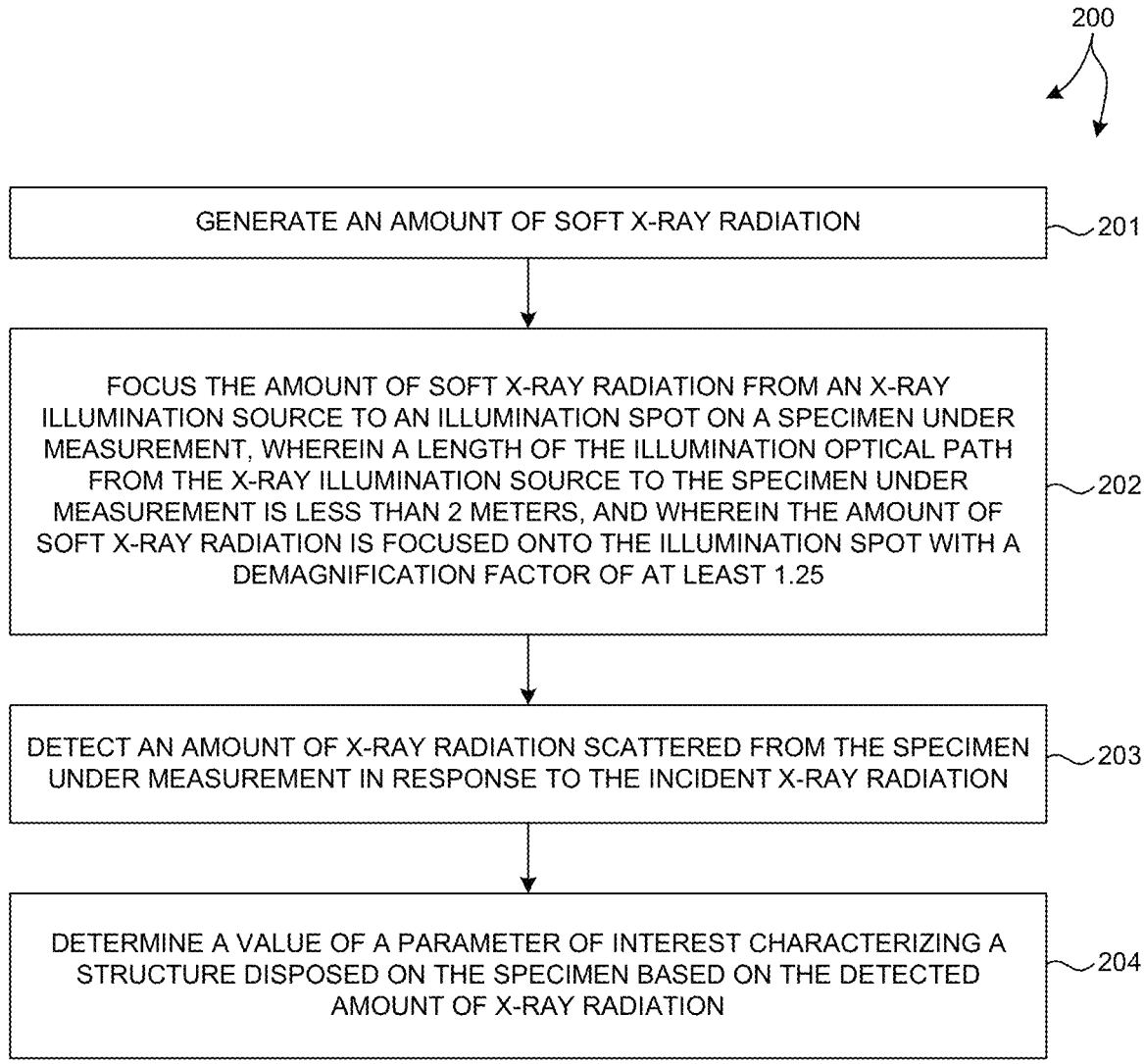
FIG. 12 is a flowchart of a method of performing SXR based measurements of a semiconductor wafer in accordance with the methods described herein.

FIG. 12 illustrates a method 200 suitable for implementation by the metrology system 100 of the present invention. In one aspect, it is recognized that data processing blocks of method 200 may be carried out via a pre-programmed algorithm executed by one or more processors of computing system 130. While the following description is presented in the context of metrology system 100, it is recognized herein that the particular structural aspects of metrology system 100 do not represent limitations and should be interpreted as illustrative only.

In block 201, an amount of soft x-ray radiation is generated by an x-ray illumination source.

In block 202, the amount of soft x-ray radiation is focused from the x-ray illumination source onto a specimen under measurement at an illumination spot. A length of the illumination optical path from the x-ray illumination source to the specimen under measurement is less than 2 meters. The amount of soft x-ray radiation is focused onto the illumination spot with a demagnification factor of at least 1.25.

In block 203, an amount of x-ray radiation scattered from the specimen under measurement in response to the incident soft x-ray illumination is detected by a detector.

In block 204, a value of a parameter of interest characterizing a structure disposed on the specimen of interest is determined based on the detected amount of x-ray radiation.

In some embodiments, scatterometry measurements as described herein are implemented as part of a fabrication process tool. Examples of fabrication process tools include, but are not limited to, lithographic exposure tools, film deposition tools, implant tools, and etch tools. In this manner, the results of a SXR analysis are used to control a fabrication process. In one example, SXR measurement data collected from one or more targets is sent to a fabrication process tool. The SXR measurement data is analyzed as described herein and the results used to adjust the operation of the fabrication process tool to reduce errors in the manufacture of semiconductor structures.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with SXR based measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
an illumination source configured to generate an amount of electromagnetic radiation including an amount of soft x-ray radiation;
an illumination optics subsystem disposed in an illumination optical path between the illumination source and a specimen under measurement, the illumination optics subsystem including one or more x-ray illumination optical elements configured to direct the amount of soft x-ray radiation from the illumination source to an illumination spot on the specimen under measurement, wherein a length of the illumination optical path from the illumination source to the specimen under measurement is less than 2 meters, and wherein the one or more x-ray illumination optical elements focus the amount of soft x-ray radiation onto the illumination spot with a demagnification factor of at least 1.25, the illumination optics subsystem including an internal field stop disposed in the illumination optical path, the internal field stop conjugate to the illumination source and the specimen under measurement;
an x-ray detector configured to detect an amount of x-ray radiation scattered from the specimen under measurement in response to the amount of soft x-ray radiation focused onto the illumination spot; and a computing system configured to determine a value of a parameter of interest characterizing a structure disposed on the specimen based on the detected amount of x-ray radiation.

2. The metrology system of claim 1, wherein the illumination source is a Laser Sustained Plasma (LSP) illumination source, the amount of electromagnetic radiation having wavelengths spanning a range from soft x-ray to infrared.

3. The metrology system of claim 1, wherein the soft x-ray radiation includes multiple illumination wavelengths within a photon energy range from 80 electronvolts to 3,000 electronvolts.

4. The metrology system of claim 1, wherein the soft x-ray radiation is incident at the illumination spot on the specimen at a nominal grazing incidence angle between 0 and 30 degrees.

5. The metrology system of claim 1, wherein the one or more x-ray illumination optical elements simultaneously focus the amount of soft x-ray radiation incident at the illumination spot on the specimen at a plurality of angles of incidence, a plurality of wavelengths, a plurality of azimuth angles, or any combination thereof.

6. The metrology system of claim 1, wherein a source area of the illumination source is characterized by a lateral dimension of 50 micrometers or more.

7. The metrology system of claim 1, wherein a source area of the illumination source is characterized by a lateral dimension of 50 micrometers or less.

8. The metrology system of claim 1, wherein the one or more x-ray illumination optical elements focus the amount of soft x-ray radiation onto the specimen with a demagnification factor of 50 or less.

9. The metrology system of claim 1, wherein the one or more x-ray illumination optical elements focus the amount of x-ray radiation onto the specimen with a demagnification factor of 4 or more.

10. The metrology system of claim 1, the one or more x-ray illumination optical elements including two or more spherically shaped mirrors configured in a Schwarzschild configuration.

11. The metrology system of claim 1, the one or more x-ray illumination optical elements including an ellipsoidally shaped mirror.

12. The metrology system of claim 1, the one or more x-ray illumination optical elements including two or more mirrors configured in a Wolter configuration.

13. The metrology system of claim 1, the one or more x-ray illumination optical elements including at least one mirror having a freeform shape.

14. The metrology system of claim 1, the one or more x-ray illumination optical elements including one or more illumination optical elements configured in a Scheimpflug configuration.

15. The metrology system of claim 1, wherein the illumination source is tilt shifted with respect to the specimen under measurement.

16. The metrology system of claim 1, wherein a size, shape, or both, of the internal field stop is adjustable to optimize throughput, minimize diffraction order cross talk, match to another metrology system, or any combination thereof.

17. The metrology system of claim 1, wherein the illumination optics subsystem includes an illumination pupil aperture.

18. The metrology system of claim 1, wherein the determining of the value of the parameter of interest is based on a combined fitting analysis of the detected amount of x-ray radiation and optical measurement signals.

19. The metrology system of claim 17, wherein a size, shape, or both, of the illumination pupil aperture is adjustable to optimize throughput, minimize diffraction order cross talk, match to another metrology system, or any combination thereof.

20. The metrology system of claim 2, wherein a target material of the LSP illumination source includes carbon dioxide in a solid state, xenon in a solid state, or a combination of two or more gases.

21. The metrology system of claim 3, wherein the one or more x-ray illumination optical elements select a subset of the multiple illumination wavelengths and focus the selected subset of the multiple wavelengths onto the specimen.

22. A method comprising:

generating an amount of x-ray radiation including an amount of soft x-ray radiation;

focusing the amount of soft x-ray radiation from an illumination source to an illumination spot on a specimen under measurement, wherein a length of the illumination optical path from the illumination source to the specimen under measurement is less than 2 meters, wherein the amount of soft x-ray radiation is focused onto the illumination spot with a demagnification factor of at least 1.25, and wherein an internal field stop is disposed in the illumination optical path, the internal field stop conjugate to the illumination source and the specimen under measurement;

detecting an amount of x-ray radiation scattered from the specimen under measurement in response to the amount of soft x-ray radiation focused onto the illumination spot; and determining a value of a parameter of interest characterizing a structure disposed on the specimen based on the detected amount of x-ray radiation.

23. The method of claim 22, further comprising:

simultaneously focusing the amount of soft x-ray radiation incident at the illumination spot on the specimen at a plurality of angles of incidence, a plurality of wavelengths, a plurality of azimuth angles, or any combination thereof.

24. The method of claim 22, wherein the focusing involves two spherically shaped mirrors configured in a Schwarzschild configuration.

25. The method of claim 22, wherein the focusing involves an ellipsoidally shaped mirror.

26. The method of claim 22, wherein the focusing involves two or more mirrors configured in a Wolter configuration.

27. The method of claim 22, wherein the focusing involves at least one mirror having a freeform shape.

28. The method of claim 22, wherein the focusing involves one or more illumination optical elements configured in a Scheimpflug configuration.

29. The method of claim 22, wherein the focusing involves tilt shifting the illumination source with respect to the specimen under measurement.

30. The method of claim 22, wherein the soft x-ray radiation includes multiple illumination wavelengths, and further comprising:

selecting a subset of the multiple illumination wavelengths; and focusing the selected subset of the multiple wavelengths onto the specimen.

31. A metrology system comprising:
- an x-ray illumination source configured to generate an amount of x-ray radiation including an amount of soft x-ray radiation, the x-ray illumination source having an x-ray illumination source size characterized by a lateral dimension of 100 micrometers or larger;
- an illumination optics subsystem disposed in an illumination optical path between the x-ray illumination source and a specimen under measurement, the illumination optics subsystem including one or more x-ray illumination optical elements configured to direct the amount of soft x-ray radiation from the x-ray illumination source to an illumination spot on the specimen under measurement characterized by a lateral dimension of 50 micrometers or less, wherein a length of the illumination optical path from the x-ray illumination source to the specimen under measurement is less than 2 meters, the illumination optics subsystem including an internal field stop disposed in the illumination optical path, the internal field stop conjugate to the x-ray illumination source and the specimen under measurement;
- an x-ray detector configured to detect an amount of x-ray radiation scattered from the specimen under measurement in response to the amount of soft x-ray radiation focused onto the illumination spot; and
- a computing system configured to determine a value of a parameter of interest characterizing a structure disposed on the specimen based on the detected amount of x-ray radiation.

* * * * *